United States Patent
Elmallah et al.

(10) Patent No.: US 12,407,341 B2
(45) Date of Patent: Sep. 2, 2025

(54) MULTI-STAGE DIGITALLY CONTROLLED DELAY LINE LINEARITY ENHANCING BY REDUNDANCY AND RANDOMIZATION

(71) Applicant: MEDIATEK INC., Hsinchu (TW)

(72) Inventors: Ahmed Safwat Mohamed Aboelenein Elmallah, San Jose, CA (US); Mohammed Mohsen Abdulsalam Abdullatif, San Jose, CA (US); Tamer Mohammed Ali, San Jose, CA (US)

(73) Assignee: MEDIATEK INC., Hsinchu (TW)

( * ) Notice: Subject to any disclaimer, the term of this patent is extended or adjusted under 35 U.S.C. 154(b) by 22 days.

(21) Appl. No.: 18/383,511

(22) Filed: Oct. 25, 2023

(65) Prior Publication Data
US 2024/0171165 A1    May 23, 2024

Related U.S. Application Data

(60) Provisional application No. 63/384,615, filed on Nov. 22, 2022.

(51) Int. Cl.
*H03K 5/1252* (2006.01)
*H03K 5/00* (2006.01)
*H03M 1/82* (2006.01)

(52) U.S. Cl.
CPC ........... *H03K 5/1252* (2013.01); *H03M 1/82* (2013.01); *H03K 2005/00058* (2013.01)

(58) Field of Classification Search
CPC .......... H03K 5/00; H03K 5/14; H03K 5/1252; H03K 2005/00286; H03K 2005/00058; H03M 1/82
See application file for complete search history.

(56) References Cited

U.S. PATENT DOCUMENTS

| | | | |
|---|---|---|---|
| 11,271,584 B2 * | 3/2022 | Choi | H03K 5/131 |
| 2019/0158080 A1 * | 5/2019 | Kuramochi | H03M 1/82 |
| 2024/0168442 A1 * | 5/2024 | Bhat | G04F 10/005 |

OTHER PUBLICATIONS

Elmallah et al. ("A 1.6ps peak-INL 5.3ns range two-step digital-to-time converter in 65nm CMOS", 2018 IEEE Custom Integrated Circuits Conference) (Year: 2018).*

(Continued)

*Primary Examiner* — Patrick C Chen
(74) *Attorney, Agent, or Firm* — Troutman Pepper Locke LLP; Tim Tingkang Xia, Esq.

(57) ABSTRACT

A circuit or reducing fractional spurs comprises a digital to time converter (DTC) comprising multiple delay stages electrically coupled to one another in series, configured such that each delay stage is binary switched till the code exceeds cell range and then it is fully turned ON, and thereafter it is moved to the next stage, each delay stage comprising a digitally controlled delay line (DCDL) having code-dependent integrated nonlinearity (INL), with the maximal value of the INL occuring at a mid-code position; and an offset stage comprising the DCDL electrically coupled to the DTC in series, configured to generate random codes for each required time delay of the DTC to ensure the probability of landing at the mid-code position is reduced and landing point is kept as far away as possible from the mid-code position for every required time delay, thereby improving the INL and the fractional spurs.

20 Claims, 6 Drawing Sheets

(56) References Cited

OTHER PUBLICATIONS

Ahmed Elmallah et al., A 1.6ps peak-INL 5.3ns range two-step digital-to-time converter in 65nm CMDS, IEEE Xplore, 2018.
Jiayoon Zhiyu Ru et al., A High-Linearity Digital-to-Time Converter Technique: Constant-Slope Charging, IEEE Journal of Solid-State Circuits, vol. 50, No. 6, 2015.
Series G: Transmission Systems and Media, Digital Systems and Networks, Digital networks—Design objectives for digital networks, Timing characteristics of SDH equipment slave clocks (SEC), 2003, ITU-T Recommendation G.813.

* cited by examiner

MULTI-STAGE DIGITALLY CONTROLLED DELAY LINE LINEARITY ENHANCING BY REDUNDANCY AND RANDOMIZATION

CROSS-REFERENCE TO RELATED APPLICATION(S)

This application claims the benefits of U.S. Provisional Application Ser. No. 63/384,615, entitled "MULTI-STAGE DIGITAL-CONTROLLED DELAY LINE LINEARITY ENHANCING BY REDUNDANCY AND RANDOMIZATION" and filed on Nov. 22, 2022, which is expressly incorporated by reference herein in its entirety.

BACKGROUND

Field

The present disclosure relates generally to signal transmission, and more particularly, to circuits and methods of enhancing multi-stage digitally controlled delay line (DCDL) linearity by redundancy and randomization.

Background

The statements in this section merely provide background information related to the present disclosure and may not constitute prior art.

. A retimer has been widely used in high-speed data transmission and acts as a repeater for high-speed serial link. In operation, the retimer receives the signal from its RX, resamples the received signal, cleans up the signal, makes it rail-to-rail, and then transmits the signal again to its TX. Ideally, the retimer should send the output data with the same frequency as the received data. Practically, the TX uses a fractional-N frequency synthesizer (TXPLL) to generate the clock used to send the data. Each TX lane uses a dedicated TXPLL to allows per-lane time independency. In addition to PPM (part per million) tracking, the fractional-N operation gives flexibility in the lane speed using a single "on PCB" reference clock generator. The fractional-N operation causes fractional spurs that can limit the achievable BER BER or bit error rate of the link as fractional spurs translates to deterministic jitter that eats from the timing margin specially for high-speed link.

Therefore, a heretofore unaddressed need exists in the art to address the deficiencies and inadequacies.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In aspects of the disclosure, a circuit, and a method, are provided.

One aspect of the disclosure relates to a circuit for reducing fractional spurs, comprising a digital to time converter (DTC) comprising a plurality of delay stages electrically coupled to one another in series, configured such that each delay stage is binary switched till the code exceeds cell range and then it is fully turned ON, and thereafter it is moved to the next stage, wherein each delay stage comprises a digitally controlled delay line (DCDL), wherein the DCDL has code-dependent integrated nonlinearity (INL), and wherein the maximal value of the INL occurs at a mid-code position of each delay stage; and an offset stage comprising the DCDL electrically coupled to the DTC in series, configured to generate random codes for each required time delay of the DTC to ensure the probability of landing at the mid-code position is reduced and landing point is kept as far away as possible from the mid-code position for every required time delay in the DTC, thereby improving the INL and therefore the fractional spurs.

In one embodiment, the DCDL is a variable slope DCDL.

In one embodiment, the DCDL comprises an inverter followed by a capacitor, configured such that, through controlling different aspects of either the inverter or the capacitor, the slope of an input clock signal is changed to provide different delays.

In one embodiment, the capacitor comprises at least one metal capacitor with at least one switch, or at least one varactor.

In one embodiment, the inverter comprises a plurality of inverters.

In one embodiment, the DCDL further comprises a variable resistor coupled between the inverter and the capacitor.

In one embodiment, the DCDL comprises a first inverter, a second inverter, a binary weighted metal-oxide-metal (MOM) capacitors array $V_x$, a first buffer, and a second buffer electrically coupled to one another in series between an input and an output of the DCDL.

In one embodiment, the binary MOM capacitors array $V_x$ comprises N capacitors with switches that are operably switched on and off in a binary fashion to achieve a code range of $2^N$ codes for the DCDL, wherein N is an integer equal to or greater than 1.

In one embodiment, the first buffer has a delay that is a function of the $V_x$'s slope, wherein the more the code range increases, the more the delay varies.

In one embodiment, the random codes are generated by a pseudorandom binary sequence (PRBS).

Another aspect of the disclosure relates to a method for reducing fractional spurs, comprising providing a circuit comprising: a digital to time converter (DTC) comprising a plurality of delay stages electrically coupled to one another in series, configured such that each delay stage is binary switched till the code exceeds cell range and then it is fully turned ON, and thereafter it is moved to the next stage, wherein each delay stage comprises a digitally controlled delay line (DCDL), wherein the DCDL has code-dependent integrated nonlinearity (INL), and wherein the maximal value of the INL occurs at a mid-code position of each delay stage; an offset stage comprising the DCDL electrically coupled to the DTC in series; and generating random codes for each required time delay of the DTC by the offset stage to ensure the probability of landing at the mid-code position is reduced and landing point is kept as far away as possible from the mid-code position for every required time delay in the DTC, thereby improving the INL and therefore the fractional spurs.

In one embodiment, the DCDL is a variable slope DCDL.

In one embodiment, the DCDL comprises an inverter followed by a capacitor, configured such that, through controlling different aspects of either the inverter or the capacitor, the slope of an input clock signal is changed to provide different delays.

In one embodiment, the capacitor comprises at least one metal capacitor with at least one switch, or at least one varactor.

In one embodiment, the inverter comprises a plurality of inverters.

In one embodiment, the DCDL further comprises a variable resistor coupled between the inverter and the capacitor.

In one embodiment, the DCDL comprises a first inverter, a second inverter, a binary weighted metal-oxide-metal (MOM) capacitors array $V_x$, a first buffer, and a second buffer electrically coupled to one another in series between an input and an output of the DCDL.

In one embodiment, the binary MOM capacitors array $V_x$ comprises N capacitors with switches that are operably switched on and off in a binary fashion to achieve a code range of $2^N$ codes for the DCDL, wherein N is an integer equal to or greater than 1.

In one embodiment, the first buffer has a delay that is a function of the $V_x$'s slope, wherein the more the code range increases, the more the delay varies.

In one embodiment, the random codes are generated by a pseudorandom binary sequence (PRBS).

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
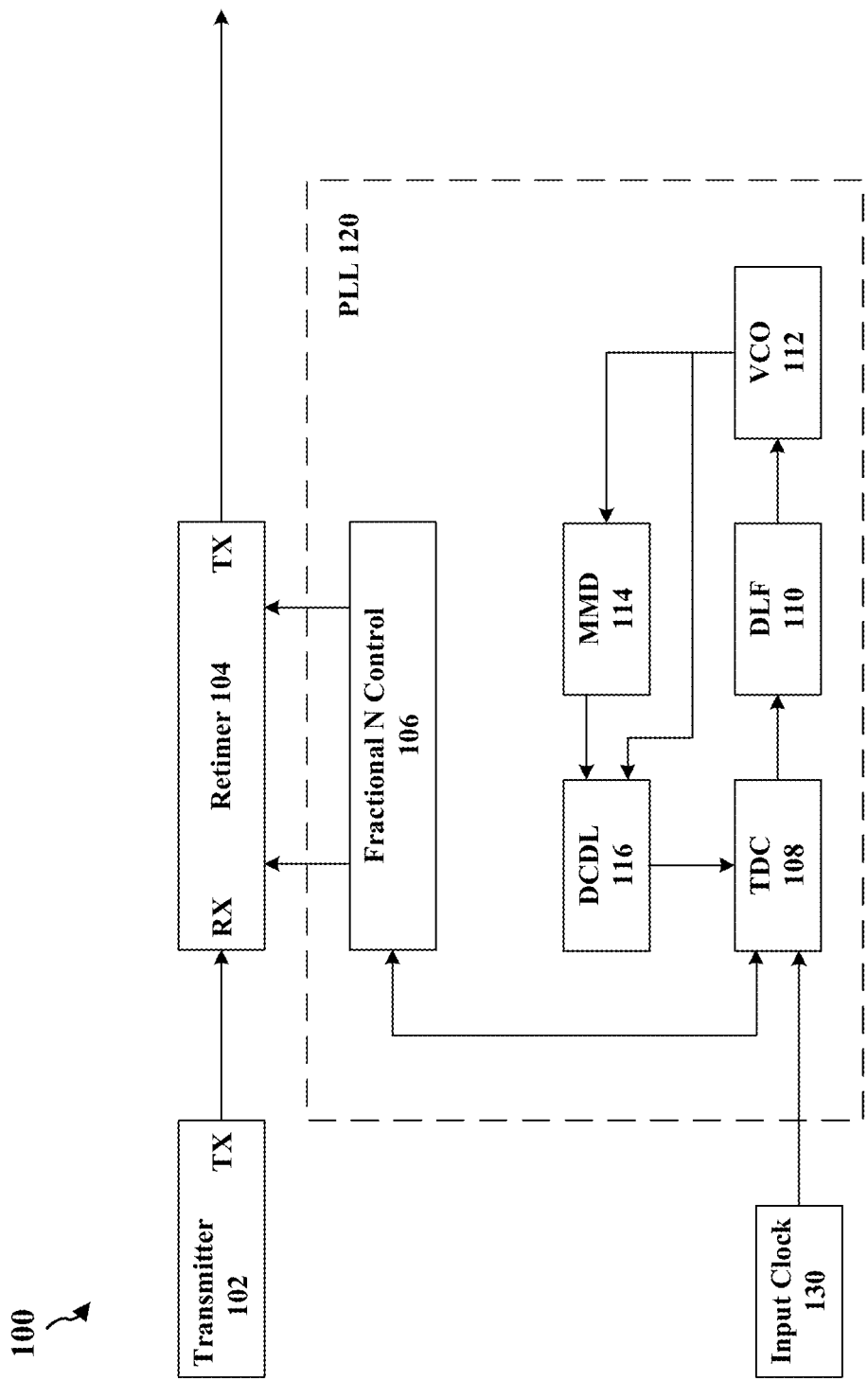
FIG. 1 is a diagram illustrating a retimer with digital fractional-N phase-locked loops (PLL).

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunications systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example aspects, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

In one aspect of the disclosure, the circuit for reducing fractional spurs comprises a digital to time converter (DTC) comprising a plurality of delay stages electrically coupled to one another in series, configured such that each delay stage is binary switched till the code exceeds cell range and then it is fully turned ON, and thereafter it is moved to the next stage, wherein each delay stage comprises a digitally controlled delay line (DCDL), wherein the DCDL has code-dependent integrated nonlinearity (INL), and wherein the maximal value of the INL occurs at a mid-code position of each delay stage.

The circuit also includes an offset stage comprising the DCDL electrically coupled to the DTC in series, configured to generate random codes for each required time delay of the DTC to ensure the probability of landing at the mid-code position is reduced and landing point is kept as far away as possible from the mid-code position for every required time delay in the DTC, thereby improving the INL and therefore the fractional spurs. In some examples, the random codes are generated by a pseudorandom binary sequence (PRBS).

In some embodiments, the DCDL is a variable slope DCDL. It should be noted that other types of DCDLs, such as a constant slope DCDL, can also be utilized to practice the invention.

According to some embodiments, the DCDL comprises an inverter followed by a capacitor, configured such that, through controlling different aspects of either the inverter or the capacitor, the slope of an input clock signal is changed to provide different delays.

In some examples, the capacitor comprises at least one metal capacitor with at least one switch, or at least one varactor. In some examples, the inverter can be replaced with a plurality of inverters. In addition, the DCDL may further comprise a variable resistor coupled between the inverter and the capacitor.

According to some embodiments, the DCDL comprises a first inverter, a second inverter, a binary weighted metal-oxide-metal (MOM) capacitors array $V_x$, a first buffer, and a second buffer electrically coupled to one another in series between an input and an output of the DCDL.

In some examples, the binary MOM capacitors array $V_x$ comprises N capacitors with switches that are operably switched on and off in a binary fashion to achieve a code range of $2^N$ codes for the DCDL, wherein N is an integer equal to or greater than 1.

In some embodiments, the first buffer has a delay that is a function of the $V_x$'s slope. The more the code range increases, the more the delay varies.

In another aspect of the disclosure, the method for reducing fractional spurs comprises providing a circuit comprising: a DTC comprising a plurality of delay stages electrically coupled to one another in series, configured such that each delay stage is binary switched till the code exceeds cell range and then it is fully turned ON, and thereafter it is moved to the next stage, wherein each delay stage comprises a DCDL, wherein the DCDL has code-dependent INL, and wherein the maximal value of the INL occurs at a mid-code position of each delay stage; an offset stage comprising the DCDL electrically coupled to the DTC in series; and generating random codes for each required time delay of the DTC by the offset stage to ensure the probability of landing at the mid-code position is reduced and landing point is kept as far away as possible from the mid-code position for every required time delay in the DTC, thereby improving the INL and therefore the fractional spurs. In some examples, the random codes are generated by a pseudorandom binary sequence (PRBS).

In some embodiments, the DCDL is a variable slope DCDL. It should be noted that other types of DCDLs, such as a constant slope DCDL, can also be utilized to practice the invention.

According to some embodiments, the DCDL comprises an inverter followed by a capacitor, configured such that, through controlling different aspects of either the inverter or the capacitor, the slope of an input clock signal is changed to provide different delays.

In some examples, the capacitor comprises at least one metal capacitor with at least one switch, or at least one varactor. In some examples, the inverter can be replaced with a plurality of inverters. In addition, the DCDL may further comprise a variable resistor coupled between the inverter and the capacitor.

According to some embodiments, the DCDL comprises a first inverter, a second inverter, a binary MOM capacitors array $V_x$, a first buffer, and a second buffer electrically coupled to one another in series between an input and an output of the DCDL.

In some examples, the binary MOM capacitors array $V_x$ comprises N capacitors with switches that are operably switched on and off in a binary fashion to achieve a code range of $2^N$ codes for the DCDL, wherein N is an integer equal to or greater than 1.

In some embodiments, the first buffer has a delay that is a function of the $V_x$'s slope. The more the code range increases, the more the delay varies.

It should be noted that different implementations of the DCDL can be used. It can be either single-end or differential, which the latter can help with rejecting like supply noise and other undesired things. In addition, it can be totally in the reference path or totally in the feedback path. Further, different DCDL architectures can also used to practice the invention.

In the following description, numerous specific details are set forth regarding the systems and methods of the disclosed subject matter and the environment in which such systems and methods may operate, etc., in order to provide a thorough understanding of the disclosed subject matter. In addition, it will be understood that the examples provided below are exemplary, and that it is contemplated that there are other systems and methods that are within the scope of the disclosed subject matter.

FIG. 1 is a diagram 100 illustrating a retimer with digital fractional-N phase-locked loops (PLL). A transmitter 102 transmits high-speed signals from its TX (transmitting channel/port). A retimer 104 which acts as a repeater for high-speed serial link receives the high-speed signals from its RX (receiving channel/port), resamples it, cleans it up and then transmits again to the TX (transmitting channel/port). The retimer 104 should send output data with the same frequency as the received data. To do this, a transmitter phase-locked loop (PLL) 120 which generates a clock used to send the data is used. The PLL 120 has the ability to do the frequency offset tracking. For example, the transmitter 102 may transmit the data at 10 GHz, the retimer 104 sometimes may generate an on-chip frequency of 10 GHz+1 MHz due to accuracies. The PLL 120 need to track the frequency offset, e.g., this 1 MHz, to make sure that the retimer 104 sends at exactly the same frequency it is receiving, e.g., 10 GHz, following exactly the received clock. The PLL 120 includes a main block which is a time to digital converter (TDC) 108, a digital loop filter (DLF) 110, a voltage-controlled oscillator (VCO) 112, a multi-modulus divider (MMD) 114, a digitally-controlled delay line (DCDL) 116 and a fractional N control block 106. The TDC 108 detects the difference between the phase of the input clocks 130 and sends this phase through the DLF 110. And sends it to the VCO 112 to correct the phase of the VCO 112. Once the VCO phase is corrected, it is sent back through the feedback path to the MMD 114. It is finally sent to the TDC 108 to measure the phase again after correction. So that is the phase-locked loop. The phase-locked loop locks the phase of the VCO 112 to the input reference clock 130 phase coming into the TDC 108. This functionality requires the PLL 120 to be operating in a fraction end mode because it is not an integer of the reference clock, it is just a very small fraction of the reference clock. The PLL 120 has to be a fraction PLL. For example, the reference clock of the input clock 130 may be 100 MHz, if the output frequency of the VCO 112 is 10 GHz, the MMD 114 would just divide the clock by 100. It becomes 100 MHz. The two clocks are the same. The TDC 108 can do this comparison. In this example, the output frequency of the VCO 112 is 10 GHz+Δf, the MMD 114 needs to divide the clock by (10 GHz+Δf)/100 MHz=100+α, an additional very small a factor has to be added so that the division becomes 10 GHz+Δf. So then this divider becomes fractional. This can be controlled by a fraction N control block 106. The fractional N operation causes fractional spurs that can limit the performance achievable bit error ratio (BER) or bit error rate of the link. Fractional spurs cause deterministic jitter basically. So, a digitally controlled delay line (DCDL) block 116 is added to cancel out the quantization noise. Since the DCDL nonlinearity is the source of the fractional spurs, the DCDL nonlinearity needs to be improved to reduce the fractional spurs.

Figure 2A:
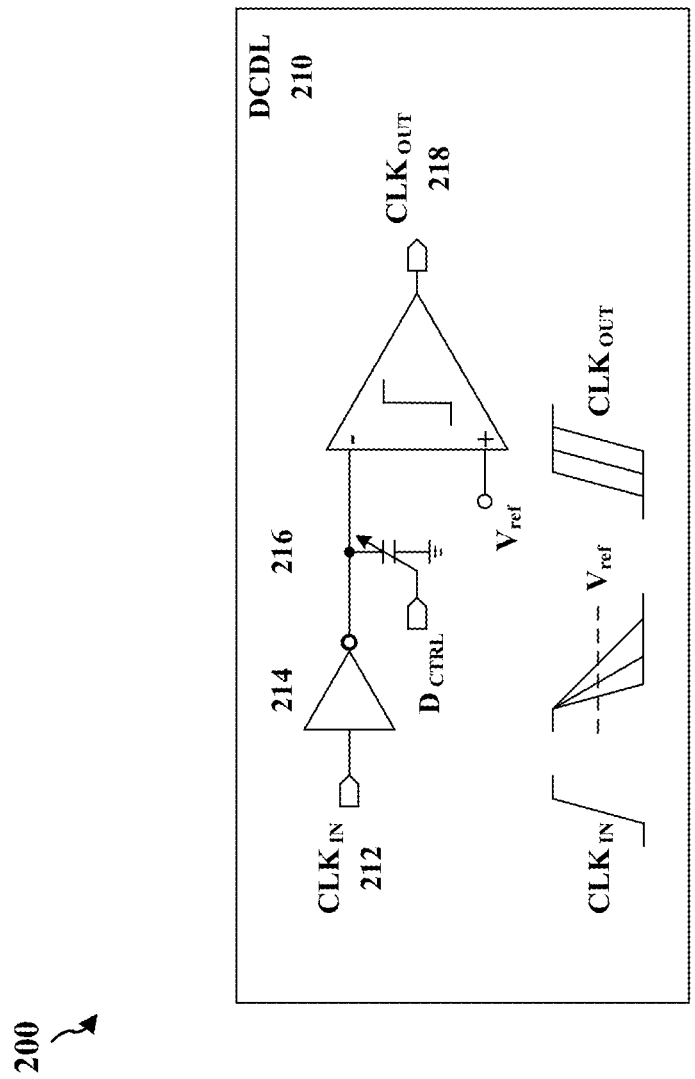
FIG. 2A is a diagram illustrating a variable slope digitally controlled delay line (DCDL) implementation.

FIG. 2A is a diagram 200 illustrating a variable slope digitally controlled delay line (DCDL) implementation. A DCDL 210 is an inverter 214 followed by a capacitor 216. Through controlling different aspects of either the inverter 214 or the capacitor 216, the slope of the input clock signal 212 can be changed so that different delays and output clock signal 218 can be provided.

Figure 2B:
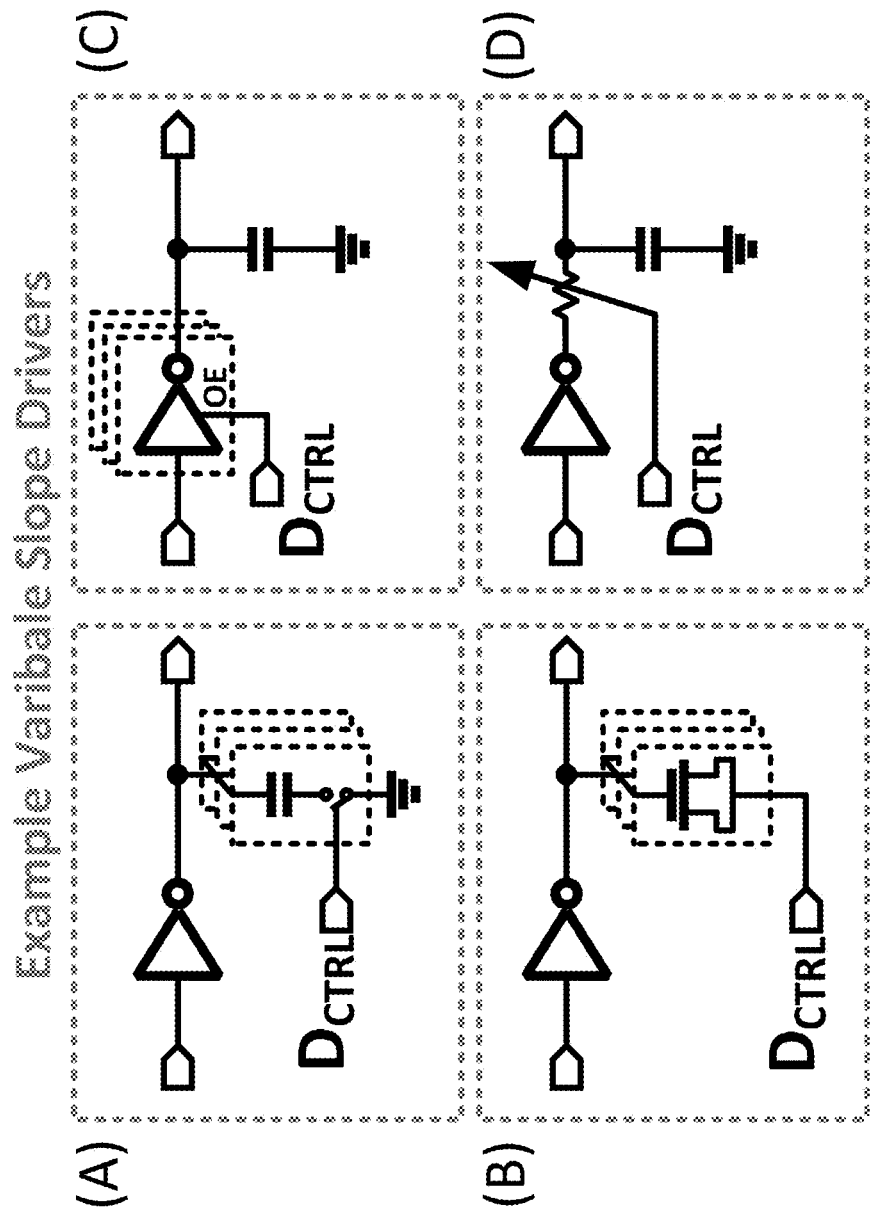
FIG. 2B shows different DCDL architectures. Panel (A) or (B): The capacitor includes at least one metal capacitor with at least one switch, or at least one varactor. Panel (C): The inverter includes a plurality of inverters. Panel (D): The DCDL further comprises a variable resistor coupled between the inverter and the capacitor.

According to some examples, different DCDL architectures can also used to practice the invention. As shown in FIG. 2B, the capacitor can be at least one metal capacitor with at least one switch, or at least one varactor (panel A or B). The inverter can be replaced with a plurality of inverters (panel C). In addition, the DCDL may further comprise a variable resistor coupled between the inverter and the capacitor (panel D).

Figure 3:
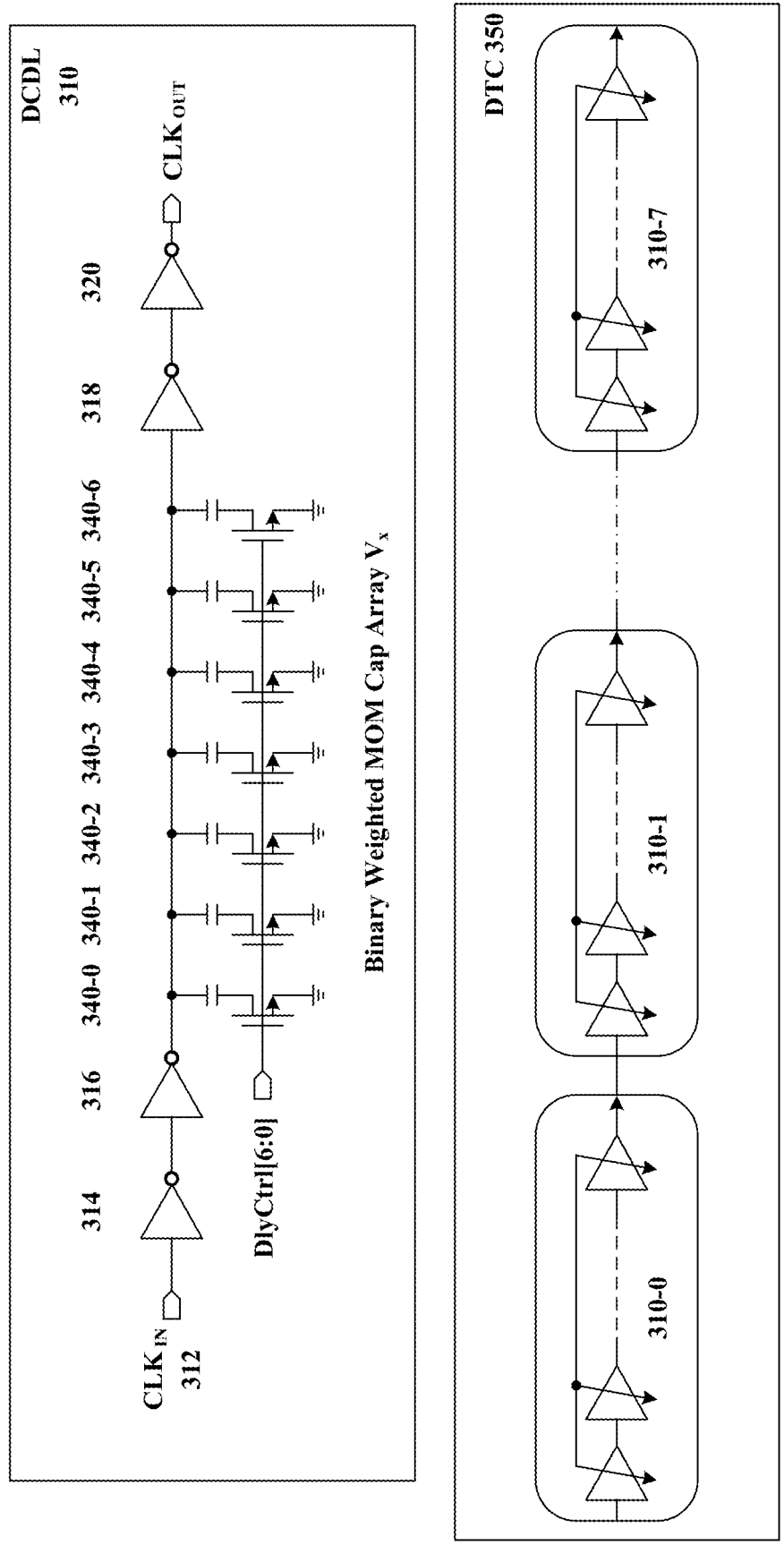
FIG. 3 is a diagram illustrating a digital to time converter (DTC) implemented with multiple cascaded stages DCDL in series.

FIG. 3 is a diagram illustrating a digital to time converter (DTC) 350 implemented with multiple cascaded stages DCDL in series. A DCDL 310 has two inverters 314 and 316, like a buffer, and then a binary weighted metal-oxide-metal (MOM) capacitors array $V_x$ includes capacitors 340-0, 340-1, ..., 340-6 with switches that can be switched on and off in a binary fashion to achieve 128 codes. Then two buffers 318 and 320 at the end just to buffer the signal. The sources of mismatch can be the random mismatches between the capacitors. It can be nonlinear capacitance at the $V_x$ node. The delay of the inverter 318 is a function of the $V_x$'s slope, it is also the dominant factor, as the more the DCDL 310 range increases, the more this delay varies. Issue with the DCDL 310 is there is usually code-dependent integrated nonlinearity (INL), which means that this delay is not the same. The delay depends on how many stages are turned on. If one stage is turned on, the delay will be Δt, but if several stages are turned on, the delay will be Δt+ε, where ε is error, because it does not behave the same way. The more slope, the more this stage responds. Thus, it has more delay. The differential nonlinearity (DNL) is defined to be the difference between the actual value and the ideal value for each digital code step. So, the DNL is the error at every step. If all the errors are added, it becomes the INL. The DNL of the DCDL 310 is a linear function. The DNL is largest at the beginning of the code range. As the code step grows, the DNL becomes smaller and smaller. In the mid-code, the actual value is very close to the ideal value so that the DNL is almost zero. Then the DNL starts going in other directions and becomes negative. The INL is the integral of the DNL in the total code range. The INL of the DCDL 310 is then a quadratic curve.

$$DNL(x)_{310} = D_{max} - \frac{D_{max}}{T}x,$$

where $D_{max}$ is DNL value at the begin of the code range, T is the mid-code.

$$INL_{DCDL\ 310} = \int_0^{2T} |DNL(x)|dx = 2\int_0^T \left(D_{max} - \frac{D_{max}}{T}x\right)dx = D_{max}T.$$

To reduce the INL, the total code range is split into multiple stages. Each stage is binary switched till code exceeds cell range and then it is fully turned ON, then it is moved to the next stage. A digital to time converter (DTC) implemented with multiple cascaded stages DCDL in series is introduced. In this example, 8 series connected DCDLs 310-0, 310-1, ..., 310-7 form a multi-stage DTC 350.

$$DNL(x)_{350} = D_{max} - \frac{D_{max}}{T/8}x.$$

$$INL_{DTC\ 350} = \int_0^{T/4} |DNL(x)|dx = 2\int_0^{T/8}\left(D_{max} - \frac{D_{max}}{T/8}x\right)dx = \frac{D_{max}T}{8}.$$

The INL is thereby 8 times reduced and 8 times improved.

Figure 4:
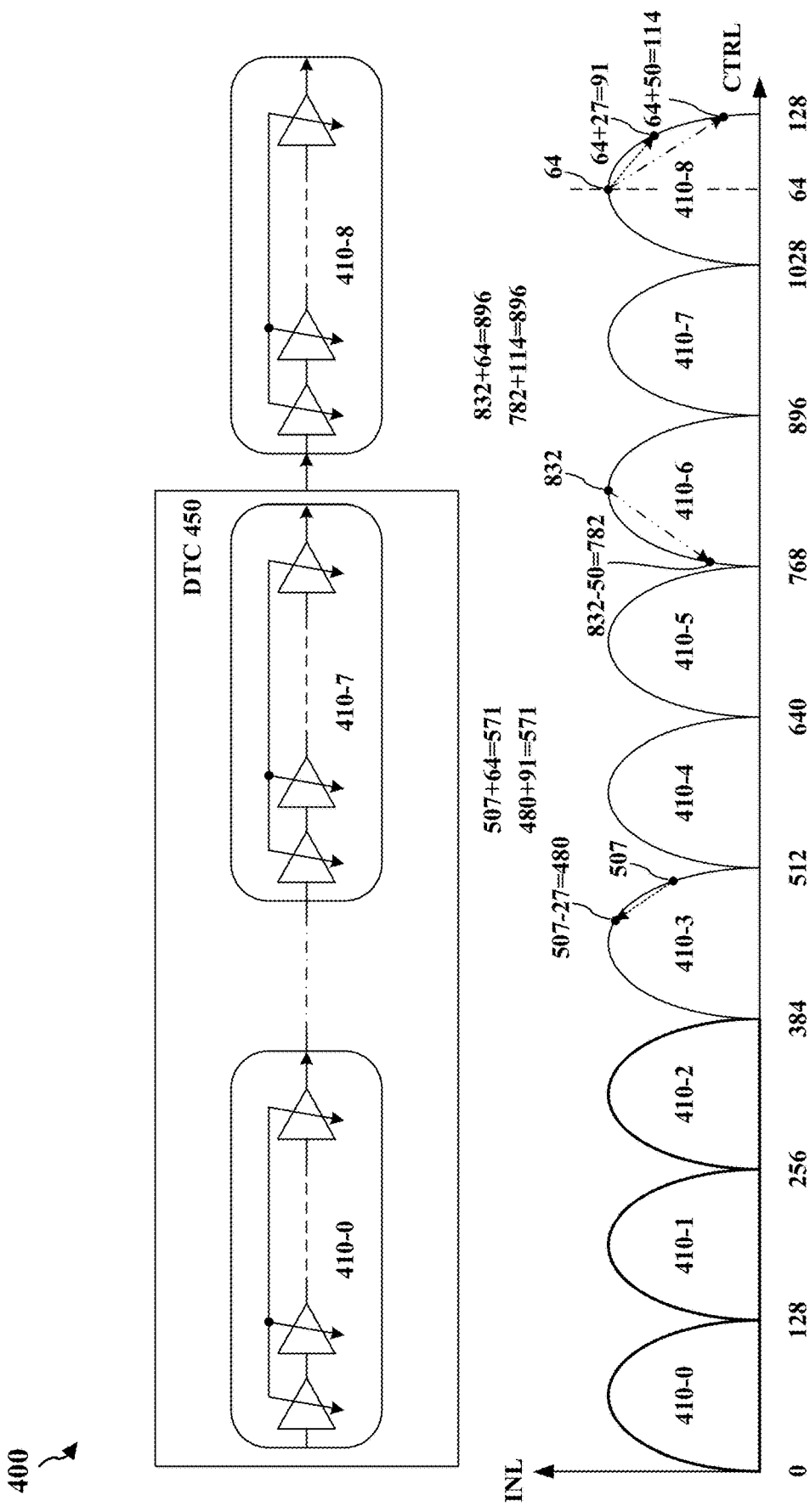
FIG. 4 is a diagram illustrating a multi-stage DTC with redundancy and randomization.

FIG. 4 is a diagram 400 illustrating a multi-stage DTC with redundancy and randomization. Following a DTC 450, a nineth stage offset DCDL 410-8 is introduced to improve the INL further. The maximal value of INL occurs at the mid-code position of each stage. If the probability of landing at the mid-code position can be reduced and landing point can be kept as far away as possible from the mid-code position for every required time delay, then the INL can be further improved, thus the fractional spurs will be also improved. The introduction of an additional random offset through the DCDL 410-8 will achieve the improvement.

In this example, each DCDL has 7 bits. So, the code ranges each DCDL is $2^7$=128. The total code range of the DTC 350 is 128*8=1024. For example, a delay of 507 is required. The DTC 350 needs to apply 507 codes. The additional stage 410-8 is set to the mid-code, at 64. The overall code delay is now 507+64=571. Now a random number between 0 and 64 will be created by a pseudorandom binary sequence (PRBS), for example 27. It is going to subtract 27 out of 507, the result is 480. Since 480=128×3+96, the first 3 stages 410-0, 410-1 and 410-2 would be completely filled up to get the maximum delay from them. And the rest 96 codes land within the fourth stage 410-3. Now it is going to add 27 to the mid-code of the additional stage 410-8, 64+27=91. So, the overall delay will be 480+91=571.

A second example, a delay of 832 is required. The DTC 350 needs to apply 832 codes. The additional stage 410-8 is set to the mid-code, at 64. The overall code delay is now 832+64=896. Now a random number between 0 and 64 will be created by PRBS, for example 50. It is going to subtract 50 out of 832, the result is 782. Since 782=128×6+14, the first 6 stages 410-0, 410-1, ..., 410-5 would be completely filled up to get the maximum delay from them. And the rest 14 codes land within the seventh stage 410-6. Now it is going to add 50 to the mid-code of the additional stage 410-8, 64+50=114. So, the overall delay will be 782+114=896.

Figure 5:
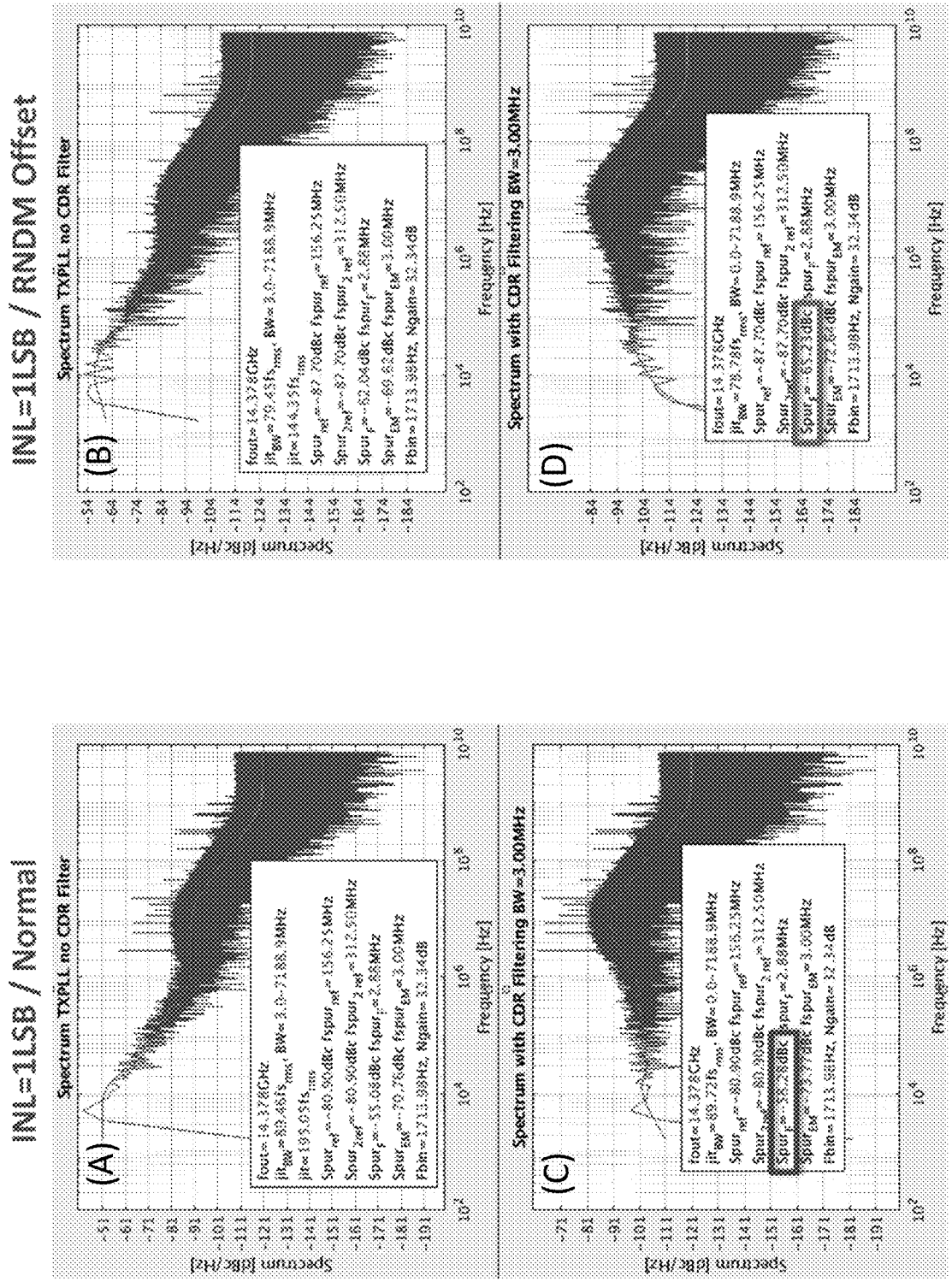
FIG. 5 shows exemplary results of a multi-stage DTC with redundancy and randomization.

Referring to FIG. 5, exemplary results of the fractional spurs in the frequency spectrum generated by a multi-stage DTC. Panels (A) and (C) are the results obtained by the normal technique with no randomization, Panels (B) and (D) are the results obtained with redundancy and randomization according to some embodiments of the invention. The latter has the fractional spurs improved at least 7 dB better than that the former one.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A circuit for reducing fractional spurs, comprising:
a digital to time converter (DTC) comprising a plurality of delay stages electrically coupled to one another in series, configured such that each delay stage of the plurality of delay stages is binary switched till a total code exceeds cell range and then it is fully turned ON, and thereafter it is moved to the next stage, wherein the each delay stage comprises a digitally controlled delay line (DCDL), wherein each of the DCDL of the each delay stage has code-dependent integrated nonlinearity (INL), and wherein the maximal value of the INL occurs at a mid-code position of the each delay stage; and
an offset stage comprising another DCDL electrically coupled to the DTC in series, configured to generate random codes for each required time delay of the DTC to ensure the probability of landing at the mid-code position is reduced and landing point is kept as far away as possible from the mid-code position for every required time delay in the DTC, thereby improving the INL and therefore the fractional spurs.

2. The device of claim 1, wherein the each of the DCDL of the each delay stage is a variable slope DCDL.

3. The device of claim 2, wherein the each of the DCDL of the each delay stage comprises an inverter followed by a capacitor, configured such that, through controlling different aspects of either the inverter or the capacitor, the slope of an input clock signal is changed to provide different delays.

4. The device of claim 3, wherein the capacitor comprises at least one metal capacitor with at least one switch, or at least one varactor.

5. The device of claim 3, wherein the inverter comprises a plurality of inverters.

6. The device of claim 3, wherein the each of the DCDL of the each delay stage further comprises a variable resistor coupled between the inverter and the capacitor.

7. The device of claim 2, wherein the each of the DCDL of the each delay stage comprises a first inverter, a second inverter, a binary weighted metal-oxide-metal (MOM) capacitors array $V_x$, a first buffer, and a second buffer electrically coupled to one another in series between an input and an output of the DCDL.

8. The device of claim 7, wherein the binary MOM capacitors array $V_x$ comprises N capacitors with switches that are operably switched on and off in a binary fashion to achieve a code range of $2^N$ codes for the each of the DCDL of the each delay stage, wherein N is an integer equal to or greater than 1.

9. The device of claim 8, wherein the first buffer has a delay that is a function of the $V_x$'s slope, wherein the more the code range increases, the more the delay varies.

10. The device of claim 1, wherein the random codes are generated by a pseudorandom binary sequence (PRBS).

11. A method for reducing fractional spurs, comprising:
providing a circuit comprising:
a digital to time converter (DTC) comprising a plurality of delay stages electrically coupled to one another in series, configured such that each delay stage of the plurality of delay stages is binary switched till a total code exceeds cell range and then it is fully turned ON, and thereafter it is moved to the next stage, wherein the each delay stage comprises a digitally controlled delay line (DCDL), wherein each of the DCDL of the each delay stage has code-dependent integrated nonlinearity (INL), and wherein the maximal value of the INL occurs at a mid-code position of the each delay stage;
an offset stage comprising another DCDL electrically coupled to the DTC in series; and
generating random codes for each required time delay of the DTC by the offset stage to ensure the probability of landing at the mid-code position is reduced and landing point is kept as far away as possible from the mid-code position for every required time delay in the DTC, thereby improving the INL and therefore the fractional spurs.

12. The method of claim 11, wherein the each of the DCDL of the each delay stage is a variable slope DCDL.

13. The method of claim 12, wherein the each of the DCDL of the each delay stage comprises an inverter followed by a capacitor, configured such that, through controlling different aspects of either the inverter or the capacitor, the slope of an input clock signal is changed to provide different delays.

14. The method of claim 13, wherein the capacitor comprises at least one metal capacitor with at least one switch, or at least one varactor.

15. The method of claim 13, wherein the inverter comprises a plurality of inverters.

16. The method of claim 13, wherein the each of the DCDL of the each delay stage further comprises a variable resistor coupled between the inverter and the capacitor.

17. The method of claim 12, wherein the each of the DCDL of the each delay stage comprises a first inverter, a second inverter, a binary weighted metal-oxide-metal (MOM) capacitors array $V_x$, a first buffer, and a second buffer electrically coupled to one another in series between an input and an output of the DCDL.

18. The method of claim 17, wherein the binary MOM capacitors array $V_x$ comprises N capacitors with switches that are operably switched on and off in a binary fashion to achieve a code range of 2codes for the each of the DCDL of the each delay stage, wherein N is an integer equal to or greater than 1.

19. The method of claim 18, wherein the first buffer has a delay that is a function of the $V_x$'s slope, wherein the more the code range increases, the more the delay varies.

20. The method of claim 11, wherein the random codes are generated by a pseudorandom binary sequence (PRBS).

* * * * *